(12) United States Patent
Yang et al.

(10) Patent No.: US 6,845,347 B1
(45) Date of Patent: Jan. 18, 2005

(54) METHOD FOR MODELING AN INTEGRATED CIRCUIT INCLUDING A DRAM CELL

(75) Inventors: Shih Hsien Yang, Hsinchu (TW); Shyh-Chyi Wong, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 684 days.

(21) Appl. No.: 09/621,698

(22) Filed: Jul. 21, 2000

(51) Int. Cl.[7] .......................... G06F 17/10; G06F 7/60; G06F 17/50
(52) U.S. Cl. ................. 703/2; 703/13; 703/14
(58) Field of Search .............................. 703/2, 13, 14, 703/18, 19, 20

(56) References Cited

U.S. PATENT DOCUMENTS

| | | |
|---|---|---|
| 5,313,398 A | 5/1994 | Rohrer et al. |
| 5,388,068 A | 2/1995 | Ghoshal et al. |
| 5,535,146 A | 7/1996 | Huang et al. |
| 5,655,109 A | 8/1997 | Hamid |
| 5,761,082 A | 6/1998 | Miura-Mattausch |
| 5,796,624 A | 8/1998 | Sridhar et al. |
| 5,889,685 A | 3/1999 | Ramachandran |
| 5,898,863 A | 4/1999 | Ofer et al. |
| 5,905,279 A * | 5/1999 | Nitayama et al. ........... 257/301 |
| 6,034,877 A * | 3/2000 | Bronner et al. ............. 365/51 |
| 6,043,562 A * | 3/2000 | Keeth ........................ 257/776 |

OTHER PUBLICATIONS

Martins et al., High Precision Interconnect Analysis, IEEE 1998.*
Kao et al., A Modeling and Circuit Reduction Methodology for Circuit Simulation of DRAM Circuits, IEEE 1995.*
Muller et al., Trench Storage Node Technology for Gigabit DRAM Generations, IEEE 1996.*
Wehn et al., Issues in Embedded DRAM Development and Applications, IEEE 1998.*
Wehn et al., Embedded DRAM Architectural Trade–Offs, IEEE 1998.*
Yang eta l., A New GCP Cell Technology for DRAM Design, IEEE 2000.*
Hamamoto et al., On the Retention Time Distribution of Dynamic Random Access Memory (DRAM), IEEE 1998.*
Voldman et al., Retrograde Well and Epitaxial Thickness Optimization for Shallow and Deep Trench Collar Mergeed Isolation and Node Trench SPT DRAM Cell and CMOS Logic Technology, IEEE 1992.*
Avant! Common Model Interface (CMI) User Guide, Jul. 1998, pp. 1–1–3–18.
Bucher et al., "The EPFL–EKV MOSFET Model Equations for Simulation," Technical Report (Jun. 1997), pp. 1–18.
"Semiconductor Memory for the 21$^{st}$ Century," Semiconductor Memory Technology and Application Trends, pp. 1–9.
Leitner, "A new approach for semiconductor models basing on SPICE model equations," Fraunhofer Institute for Integrated Circuits, pp. 119–123.

* cited by examiner

*Primary Examiner*—W. Thomson
(74) *Attorney, Agent, or Firm*—Finnegan, Henderson, Farabow, Garrett & Dunner, L.L.P.

(57) ABSTRACT

Method and apparatus determine the performance of an integrated circuit that includes at least one of a plurality of deep-well trench dynamic random-access memory (DRAM) cells. The method includes executing a circuit simulator for designing an integrated circuit that contains at least one of a plurality of DRAM cells. Further, the method includes calculating a set of output parameters with the circuit simulator for each of the plurality of DRAM cells utilizing, for example, a deep-well trench DRAM cell model for each of the plurality of DRAM cells.

36 Claims, 6 Drawing Sheets

METHOD FOR MODELING AN INTEGRATED CIRCUIT INCLUDING A DRAM CELL

BACKGROUND OF THE INVENTION

I. Field of Invention

The present invention relates generally to systems and methods for designing and manufacturing an integrated circuit. More particularly, the present invention relates to a method and apparatus for determining the performance of an integrated circuit that includes at least one of a plurality of deep-well trench dynamic random-access memory (DRAM) cells.

II. Description of the Related Art

Since modern integrated circuits frequently comprise more than one million transistors, systems and methods for designing complex integrated circuits are essential parts of the process of designing and manufacturing integrated circuits. Without such systems and methods, the design and manufacture of an integrated circuit would be prohibitively expensive.

To design an integrated circuit, a circuit diagram is first produced based on a functional description and specification of the integrated circuit. Generally, the properties of the circuit diagram are calculated with the assistance of a circuit simulator. If the circuit simulator determines that the circuit diagram does not satisfy the functional description and specification, modifications of the circuit diagram are made, and the properties of the modified circuit diagram are again calculated with the circuit simulator. The circuit diagram is modified and simulated until the properties of the circuit diagram satisfy the functional description and specification. With an acceptable circuit diagram, the production of a circuit layout based on the circuit diagram occurs. Using the circuit layout, masks are produced, which are ultimately used to manufacture or fabricate the integrated circuit.

In accordance with conventional approaches, the properties (e.g., relevant electrical circuit quantities corresponding to the functional description and specification) of an electronic device contained within an integrated circuit are calculated in the circuit simulator with the assistance of a model for the electronic device. For example, a transistor model provides relevant electrical circuit parameters for the terminal nodes of the transistor (e.g., source, drain, gate, and substrate) within an integrated circuit. The quality of the transistor model determines how well the properties that are calculated by the circuit simulator match the actual performance of the integrated circuit that is subsequently fabricated.

Numerous circuit simulators (also referred to as circuit emulation programs) exist including, for example, SPICE, ELDO, SMASH, SABER, VERILOG™, and VHDL. Developed at the University of California at Berkeley, SPICE (simulation program with emphasis on circuit emulation) is an integrated circuit emulation program, which emulates the performance of individual circuit elements (e.g., transistors). SPICE may be used to emulate the performance of one or more transistors in the circuit. SPICE programs are commercially available from a number of vendors (e.g., HSPICE, PSPICE). VERILOG™ or VHDL are hardware description languages, which may be used to describe integrated circuit design at a logic level. VERILOG-XL™ produced by Cadence Design Systems, Inc., of San Jose, Calif., is a software program that emulates the performance of a circuit described using the VERILOG™ hardware description language. The VERILOG-XL™ program may perform a number of functions. One function, for example, may be to calculate propagation delays generated by successive gates. The VERILOG-XL™ program may calculate such propagation delays and use delay information to calculate overall propagation delays for a particular cell or group of cells. Similarly, the simulation programs mentioned herein may simulate cell speed and noise.

In a circuit simulator, such as SPICE or VERILOG™, each electronic device contained within the integrated circuit is represented by a model. Such a model must be able to represent both static (i.e., slow) and dynamic (i.e., rapid) changes that affect the integrated circuit. The design of many DRAMS has to date not been able to benefit from accurate circuit simulation before fabrication because no accurate model for a deep-trench DRAM cell exists. One particularly difficult problem for such a model is representation of noise (e.g., crosstalk between adjacent devices).

The deep-trench DRAM cell is a logic device that, among other things, provides sufficient cell capacitance utilizing conventional insulator materials. Further, the deep-trench DRAM cell provides a smaller die size and softer error rates for a given geometry, when compared to other related devices. Consequently, the deep-trench DRAM cell permits easier integration with other devices in an integrated circuit environment. With smaller die sizes, the deep-trench DRAM cell also permits a design with a higher cell density, when compared to other related devices.

SUMMARY OF THE INVENTION

Accordingly, the present invention is directed to a method and apparatus for designing and manufacturing an integrated circuit that includes at least one of a plurality of deep-well trench dynamic random-access memory (DRAM) cells, which substantially obviates one or more of the problems due to limitations and disadvantages of the related art.

Additional features and advantages of the invention will be set forth in part in the description which follows, and in part will be obvious from the description, or may be learned by practice of the invention. The objectives and advantages of the invention may be realized and attained by means of the instrumentalities and combinations particularly pointed out in the appended claims.

To achieve these and other advantages and in accordance with the purpose of the invention, as embodied and broadly described herein, there is provided a method for modeling an integrated circuit comprising executing a circuit simulator for designing an integrated circuit, wherein the integrated circuit contains at least one of a plurality of DRAM cells; and calculating a set of output parameters with the circuit simulator for each of the plurality of DRAM cells, wherein calculating the set of output parameters further comprises utilizing a deep-well trench DRAM cell model for each of the plurality of DRAM cells.

In another embodiment of the present invention, there is provided an apparatus for modeling an integrated circuit comprising means for executing a circuit simulator for designing an integrated circuit, wherein the integrated circuit contains at least one of a plurality of DRAM cells; and means for calculating a set of output parameters with the circuit simulator for each of the plurality of DRAM cells, wherein the means for calculating the set of output parameters further comprises means for utilizing a deep-well trench DRAM cell model for each of the plurality of DRAM cells.

In yet another embodiment of the present invention, there is provided a computer program product comprising computer-readable media having computer-readable code which, when run on a computer, causes the computer to model an integrated circuit with at least one of a plurality of DRAM cells comprising the following computer-readable program code for effecting actions in the computer: program code for executing a circuit simulator for designing an integrated circuit, wherein the integrated circuit contains at least one of a plurality of DRAM cells; and program code for calculating a set of output parameters with the circuit simulator for each of the plurality of DRAM cells, wherein the program code for calculating the set of output parameters further comprises program code for utilizing a deep-well trench DRAM cell model for each of the plurality of DRAM cells.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate an embodiment of the invention and, together with the description, serve to explain the objects, advantages and principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Generally, the present invention is directed to a method and apparatus for designing and fabricating an integrated circuit that includes at least one of a plurality of deep-well trench DRAM cells. Further, in accordance with embodiments of the present invention, a set of output parameters is determined using, among other things, a set of input parameters, a circuit simulator, and a deep-well trench DRAM cell model.

Figure 1:
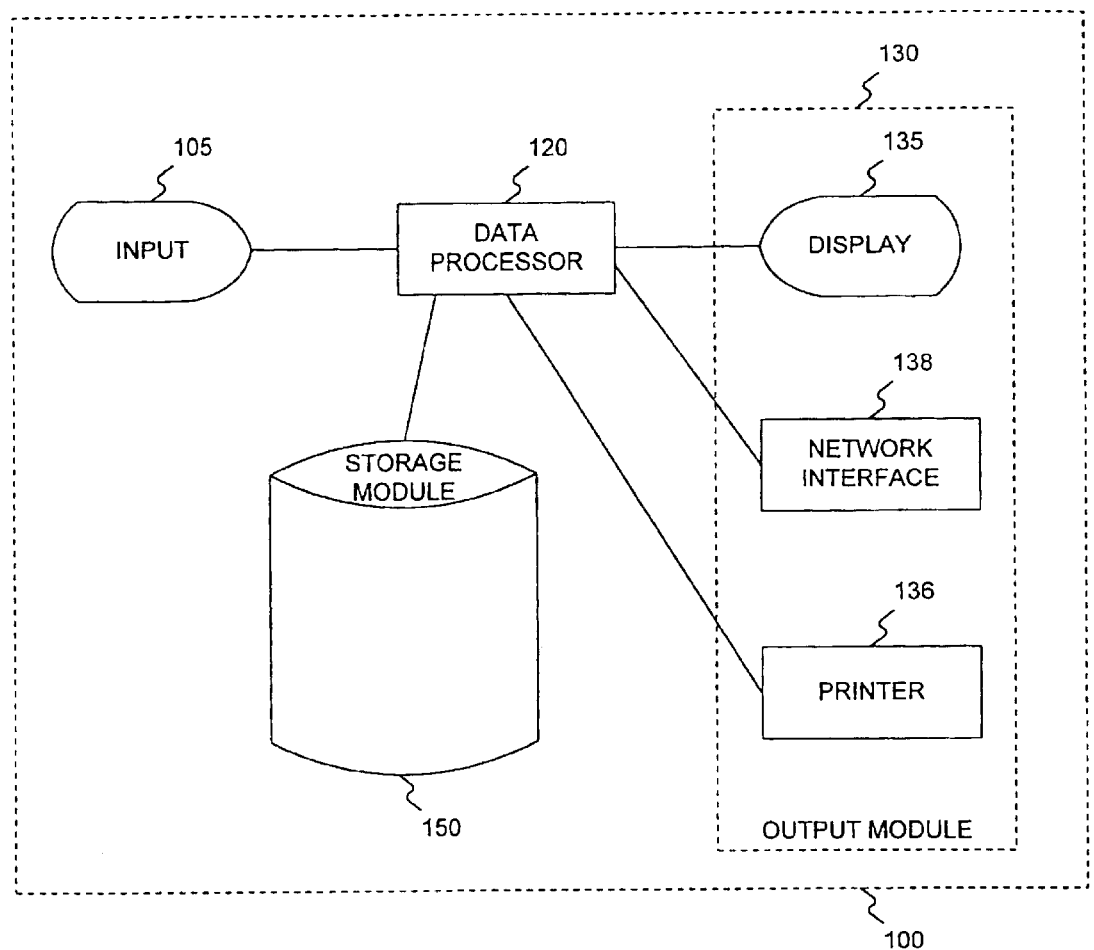
FIG. 1 illustrates, in general block diagram form, an exemplary system for modeling an integrated circuit using a deep-well trench DRAM cell model, constructed in accordance with the present invention.

FIG. 1 illustrates, in general block diagram form, an exemplary system 100 capable of executing steps of modeling an integrated circuit that includes at least one of a plurality of deep-well trench dynamic random access memory (DRAM) cells. As shown in FIG. 1, the system 100 includes an input module 105, a data processor 120, a storage module 150, and an output module 130. The output module 130 includes a display 135, a printer 136, a network interface 138, and/or other output subsystems for further processing and/or for viewing design information. The data processor 120 accepts a set of input parameters defining a possible design for the integrated circuit from the input module 105. The data processor 120 then executes a circuit simulator using, among other things, the set of input parameters and a model for the deep-well trench DRAM cell (also referred to herein as the deep-well trench DRAM cell model). The data processor 120 determines the set of output parameters that defines the performance of a possible design for the integrated circuit that includes at least one of a plurality of deep-well trench DRAM cells. If the design is acceptable, the data processor 120 provides the output module 130 with the set of output parameters for viewing on the display 135, viewing on the printer 136, and/or forwarding by the network interface 138. If the design is unacceptable, the input module 105 provides another set of input parameters corresponding to another design for execution by the circuit simulator running on the data processor 120. The input module 105 of FIG. 1 may be implemented with a variety of devices to receive a set of input parameters and provide the set of input parameters to the data processor 120. Some of these devices (not shown) include, for example, a network interface module, a modem, a keyboard, a mouse, and an input storage device. FIG. 1 only illustrates a single data processor 120 for system 100, but it is possible to use a set of data processors to perform the functions of designing an integrated circuit using the deep-well trench DRAM cell model. The data processor module 120 may also include, for example, one or more of the following additional components: one or more central processing units, a co-processor, memory, registers, and other data processing devices and systems as appropriate. The storage module 150 of FIG. 1 may store the deep-well trench DRAM cell model, which is utilized during the design of an integrated circuit that includes at least one of a plurality of deep-well trench DRAM cells. The storage module 150 can be embodied with a variety of components or subsystems including, for example, a hard drive, an optical drive, a general purpose storage device, a removable storage device, and/or other devices capable of storing the deep-well trench DRAM cell model. Further, although storage module 150 is illustrated in FIG. 1 as being separate or independent from data processor 120, the storage module and data processor may be implemented as part of a single platform or system.

In the system 100 of FIG. 1, the output module 130 is used to output or view the set of output parameters that describes the performance of the possible design for the integrated circuit containing at least one of a plurality of deep-well trench DRAM cells. The output module 130 may be implemented with a variety of systems, subsystems, and devices including, for example, the display 135, the printer 136, and the network interface 138. In addition, the output module 130 may include other systems, subsystems, follow-on processors and devices (not shown) capable of providing an output, such as a cathode ray tube, a liquid crystal display, or a storage device. Further, the system 100 and/or any of the above modules, devices, components, or functions of the invention may be embodied in any suitable combination of hardware, software, or firmware and may be embodied as a separate system or incorporated into another device.

Figure 2:
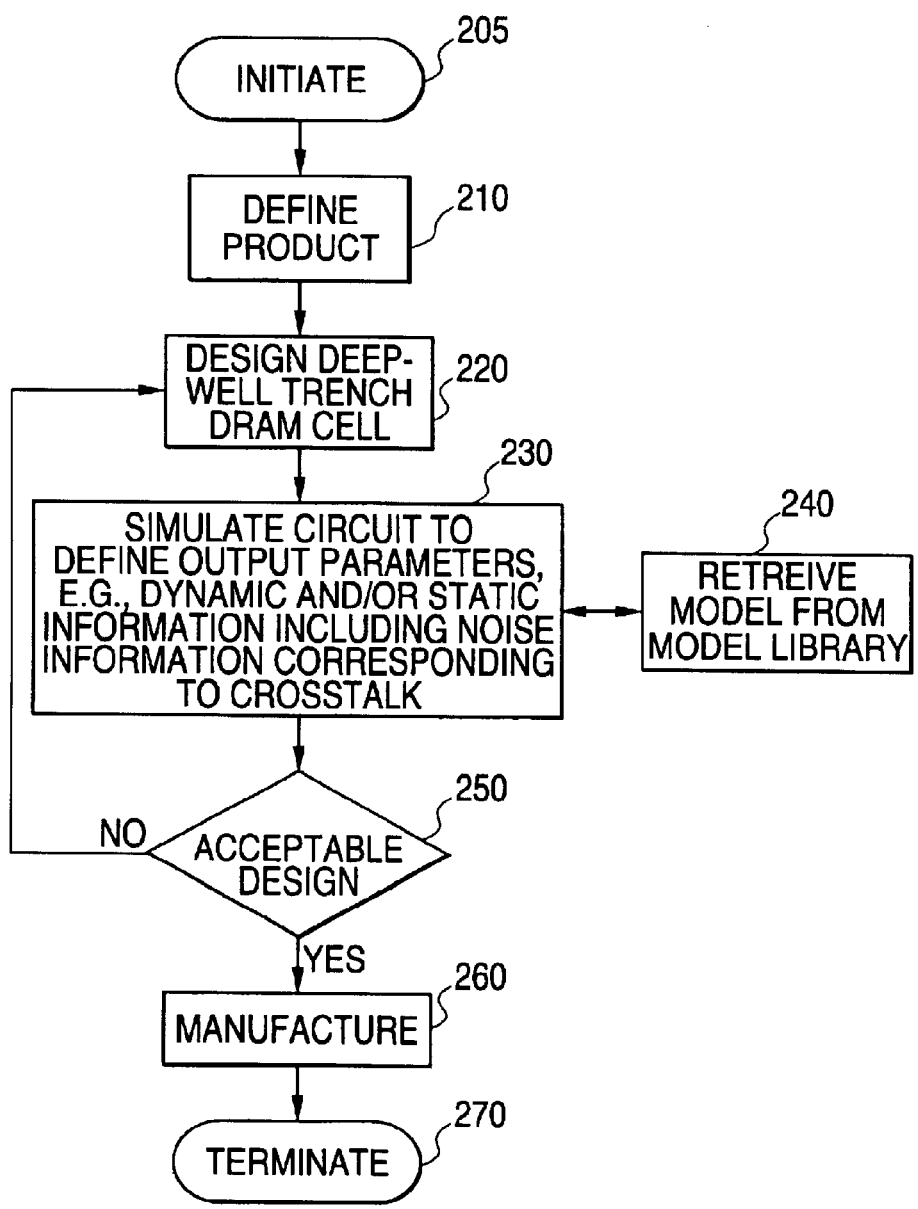
FIG. 2 is an exemplary flow chart depicting steps associated with modeling an integrated circuit using a deep-well trench DRAM cell model, in accordance with the present invention.

FIG. 2 is an exemplary flow chart depicting steps associated with modeling an integrated circuit using the deep-well trench DRAM cell model, in accordance with the present invention. Referring to FIG. 2, a user (e.g., an engineer, a designer, or an integrated circuit designer) utilizes the input module 105 (e.g., a keyboard) to initiate (step 205) the steps associated with modeling an integrated circuit by providing a set of input parameters that defines a possible design of the integrated circuit that includes at least one of a plurality of deep-well trench DRAM cells. The input module 105 provides the data processor 120 with a set of input parameters that defines the possible design of the integrated circuit that includes at least one of a plurality of deep-well trench DRAM cells (step 210). With the set of input parameters, the data processor 120 designs the at least one of a plurality of deep-well trench DRAM cells (step 220); executes a circuit simulator (step 230) that determines a set of output parameters utilizing the deep-well trench DRAM cell model (step 240) stored in the storage module 150 for the at least one of a plurality of deep-well trench DRAM cells. If the candidate set of output parameters is acceptable (step 250), the data processor 120 provides the set of output parameters to the output module 130 for display 135, printing 136, or forwarding 138. If the set of output parameters is unacceptable (step 250), the data processor 120 repeats steps 220–250 for another design of the integrated circuit that includes at least one of a plurality of deep-well trench DRAM cells. Preferably, the steps associated with modeling an integrated circuit terminate (step 270) when the set of output parameters are determined to be acceptable and provide information suitable for manufacturing (step 260) the at least one of a plurality of deep-well trench DRAM cells.

To initiate (step 205) the steps associated with modeling an integrated circuit, the user utilizes the input module 105 (e.g., a keyboard) to initiate (step 205) the steps associated with modeling an integrated circuit by providing a set of input parameters that defines a possible design of the integrated circuit that includes at least one of a plurality of deep-well trench DRAM cells. By way of non-limiting example, the user may use a keyboard (not shown) to provide the set of input parameters. Although in this embodiment the user initiates (step 205) the steps associated with modeling an integrated circuit by providing the set of input parameters, a processor may also initiate the steps associated with modeling an integrated circuit (step 205).

To define the integrated circuit that includes at least one of a plurality of deep-well trench DRAM cells (step 210), the input module 105 provides the data processor 120 with a set of input parameters defining a possible design of the integrated circuit that includes at least one of a plurality of deep-well trench DRAM cells. In this embodiment, these input parameters may be predetermined by a user or predetermined by a previously executed process or program such as a circuit simulator. By way of non-limiting example, the set of input parameters includes a wide variety of functional, performance, physical, electrical, process, and environmental information corresponding to the possible design of the integrated circuit, which includes at least one of a plurality of deep-well trench DRAM cells. For example, the set of input parameters may include one or more of the following: gate oxide thickness ($t_{ox}$), maximum applied supply voltage ($V_{dd}$), type of gate material, substrate doping concentration ($N_B$), source/drain junction depth ($N_S$, $N_D$), junction doping concentration, and operating temperature (T). By way of non-limiting example, in an exemplary set of input parameters includes, for example, $t_{ox}$=70 Å, $V_{dd}$=2.5 volts, $n^+$ poly gate, $N_B$=3($10^{17}$) atoms/cm$^3$ (p-well), $N_S$=$N_D$=$10^{19}$, and T=85° Celsius.

With the set of input parameters, the data processor 120 designs the integrated circuit that includes at least one of a plurality of deep-well trench DRAM cells (step 220). To design the integrated circuit that includes at least one of a plurality of deep-well trench DRAM cells, the data processor 120 executes a circuit simulator (step 230). The circuit simulator may consist of a variety of simulators including, for example, SPICE, HSPICE, PSPICE, ELDO, SMASH, SABER, VERILOG™, or VHDL. The data processor 120 provides the set of input parameters to the circuit simulator. As the data processor 120 executes the circuit simulator, the data processor 120 retrieves the deep-well trench DRAM cell model (step 240) stored in the storage module 150. When the circuit simulator calculates the set of output parameters, the deep-well trench DRAM cell model serves as a constraint to the set of output parameters given the set of input parameters. The set of output parameters provides dynamic and/or static information about the performance of the integrated circuit that includes at least one of a plurality of deep-well trench DRAM cells. Further, the dynamic and static information may include speed or noise (e.g., crosstalk from adjacent cells) information associated with transient and direct current (D.C.) operation of the deep-well trench DRAM cell.

Figure 3:
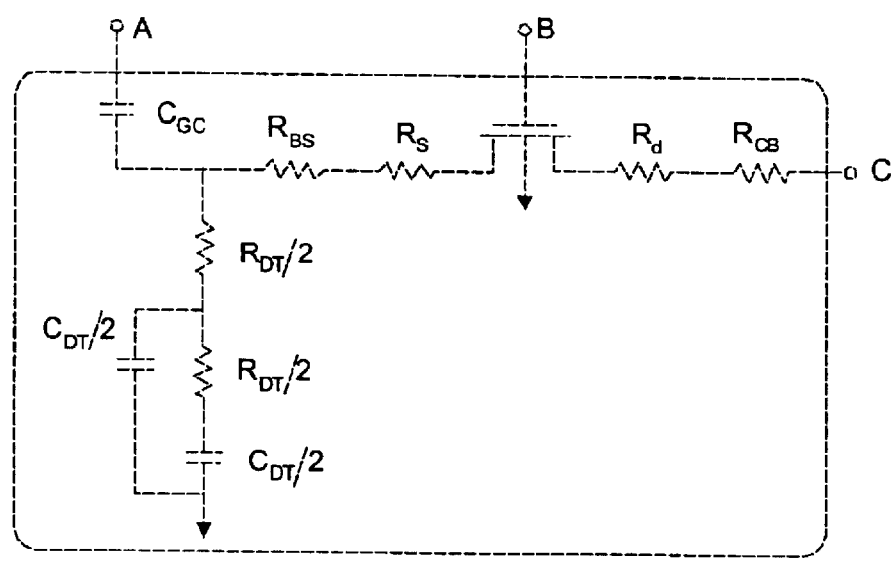
FIG. 3 illustrates a model for the deep-well trench DRAM cell (also referred to herein as the deep-well trench DRAM cell model), designed in accordance with the present invention.

FIG. 3 illustrates the deep-well trench DRAM cell model, designed in accordance with an embodiment of the present invention. Referring to FIG. 3, the deep-well trench DRAM cell model is defined by a combination of electrically connected components including, for example, source resistance ($R_s$), drain resistance ($R_d$), borderless contact ($R_{CB}$), buried strap resistance ($R_{BS}$), deep trench resistance ($R_{DT}$), deep trench capacitance ($C_{DT}$), and coupling capacitance ($C_{GC}$). The coupling capacitance ($C_{GC}$) connected to the neighboring word line on the deep trench capacitor (e.g., terminal A) represents, among other things, noise caused by, for example, coupling effects such as crosstalk. The deep-well trench DRAM cell model permits the user to design an integrated circuit containing at least one of a plurality of deep-well trench DRAM cells and to determine a set of output parameters that characterizes the dynamic and static performance of the at least one of a plurality of deep-well trench DRAM cells. By way of non-limiting example, the deep-well trench DRAM cell model permits the user to model or simulate the speed (e.g., write speed and/or read speed) of a proposed integrated circuit containing at least one of a plurality of deep-well trench DRAM cells. Further, such model permits the designer to model or simulate noise within the deep-well trench DRAM cell caused by, among other things, coupling from adjacent cells. Consequently, embodiments consistent with the present invention provide a novel method and apparatus for designing an integrated circuit that includes at least one of a plurality of deep-well trench DRAM cells. Moreover, the deep-well trench DRAM cell model shown in FIG. 3 provides a more accurate representation of the actual performance of the integrated circuit that is ultimately manufactured or fabricated.

Figure 4:
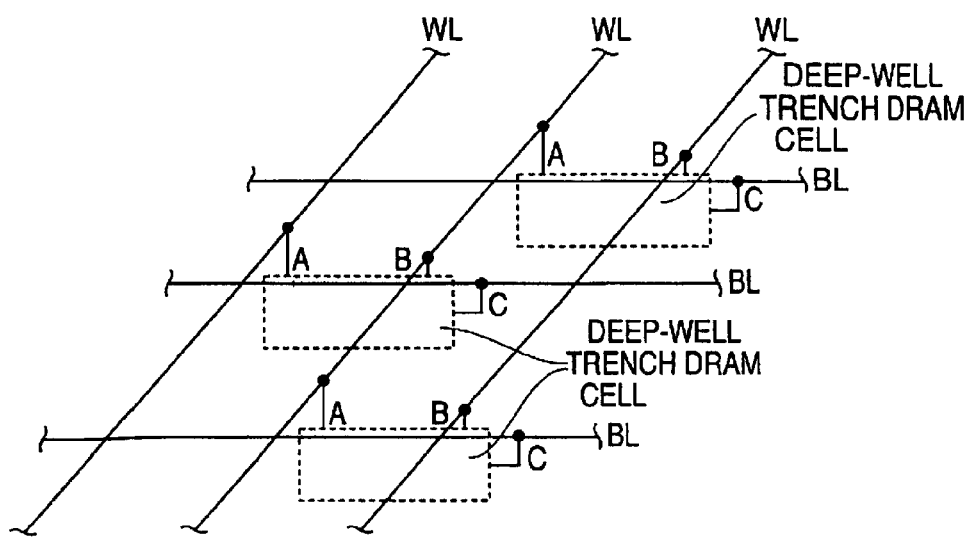
FIG. 4 illustrates circuit level interactions of deep-well trench DRAM cells within the deep-well trench DRAM cell model.

FIG. 4 illustrates cell-level interactions (e.g., noise caused by coupling from adjacent cells such as crosstalk) between deep-well trench DRAM cells within the deep-well trench cell model. Referring to FIGS. 3 and 4, each deep-well trench DRAM cell of FIG. 4 corresponds to the deep-well trench cell model, as shown in FIG. 3. Further, each of the terminals of the deep-well trench DRAM cell are labeled "A", "B", and "C" on FIG. 4 and corresponds to the "A", "B", and "C" on FIG. 3 respectively. FIG. 4 also illustrates that terminal A and terminal B are each connected to a different write line (WL) and terminal C is connected to a bit line (BL). Since terminal A is connected to, among other things, the coupling capacitance (see, e.g. $C_{GC}$ at FIG. 3), embodiments consistent with the present invention permit the user to model or simulate noise caused by, for example, coupling effects such as crosstalk.

Figure 5:
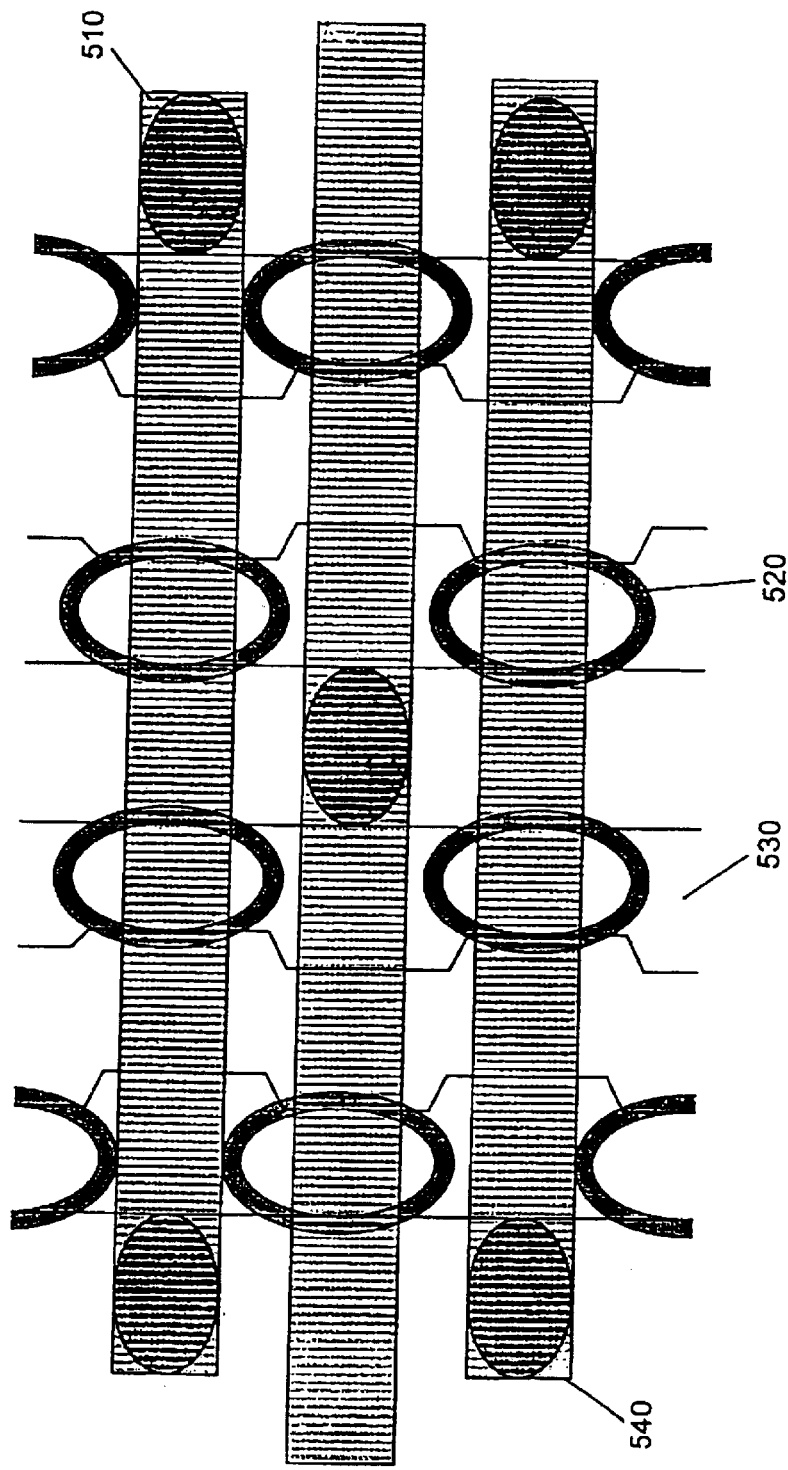
FIG. 5 illustrates the memory array layout for deep-well trench DRAM.

FIG. 5 illustrates the memory array layout for deep-well trench DRAM. Referring to FIG. 5, FIG. 5 illustrates, inter alia, a plurality of bit lines (e.g., bit line 510), a plurality of deep trench capacitors (e.g., deep trench capacitor 520), a plurality of word lines (e.g., word line 530), and a plurality of borderless contacts (e.g., borderless contact 540). Referring to FIGS. 4 and 5, the word line 530 and the bit line 510 are similar to the write line (WL) and the bit line (BL) illustrated in FIG. 4.

Referring again to FIG. 2, if the candidate set of output parameters is acceptable (step 250), the data processor 120 provides the set of input parameters and/or the set of output parameters to the output module 130 for displaying 135, printing 136, or forwarding 138. To determine whether the set of output parameters is acceptable (step 250), the data processor 120 compares the set of output parameters to a predetermined set of criteria. By way of non-limiting example, the data processor 120 may compare the set of output parameters to a predetermined set of criteria that may include ranges for acceptable values for the dynamic and static performance (e.g., the noise and speed of the deep-well trench DRAM cells) of the at least one of a plurality of deep-well trench DRAM cells. Furthermore, if the set of output parameters is acceptable (step 250), the set of input parameters and the set of output parameters provide information suitable for manufacturing (step 260) the at least one of a plurality of deep-well trench DRAM cells.

If the candidate set of output parameters is unacceptable (step 250), the data processor 120 repeats steps 220–250 for another design of the integrated circuit that includes at least one of a plurality of deep-well trench DRAM cells by changing, for example, at least one of the parameters from the set of input parameters (e.g., changing the source/drain junction depth). By way of non-limiting example, if the set of output parameters includes a noise value for the deep-well trench DRAM cell that exceeds a predetermined range of acceptable noise values, the data processor 120 (or user) may generate another design by varying the value of at least one of the parameters from the set of input parameters (step 220). After varying at least one of the input parameters (step 220), the data processor 120 executes the circuit simulator (step 230) that determines another set of output parameters utilizing the deep-well trench DRAM cell model (step 240) stored in the storage model 150. The data processor 120 then determines whether the design is acceptable (step 250). If the current set of output parameters is acceptable, the data processor 120 provides the set of output parameters to the output module 130 for displaying 135, printing 136, or forwarding 138. If the current set of output parameters is still unacceptable, the data processor 120 repeats steps 220–250 until an acceptable set of output parameters is determined. Preferably, the steps associated with modeling an integrated circuit terminate (step 270) when the set of output parameters are determined to be acceptable and provide information suitable for manufacturing (step 260) the at least one of a plurality of deep-well trench DRAM cells.

Figure 6:
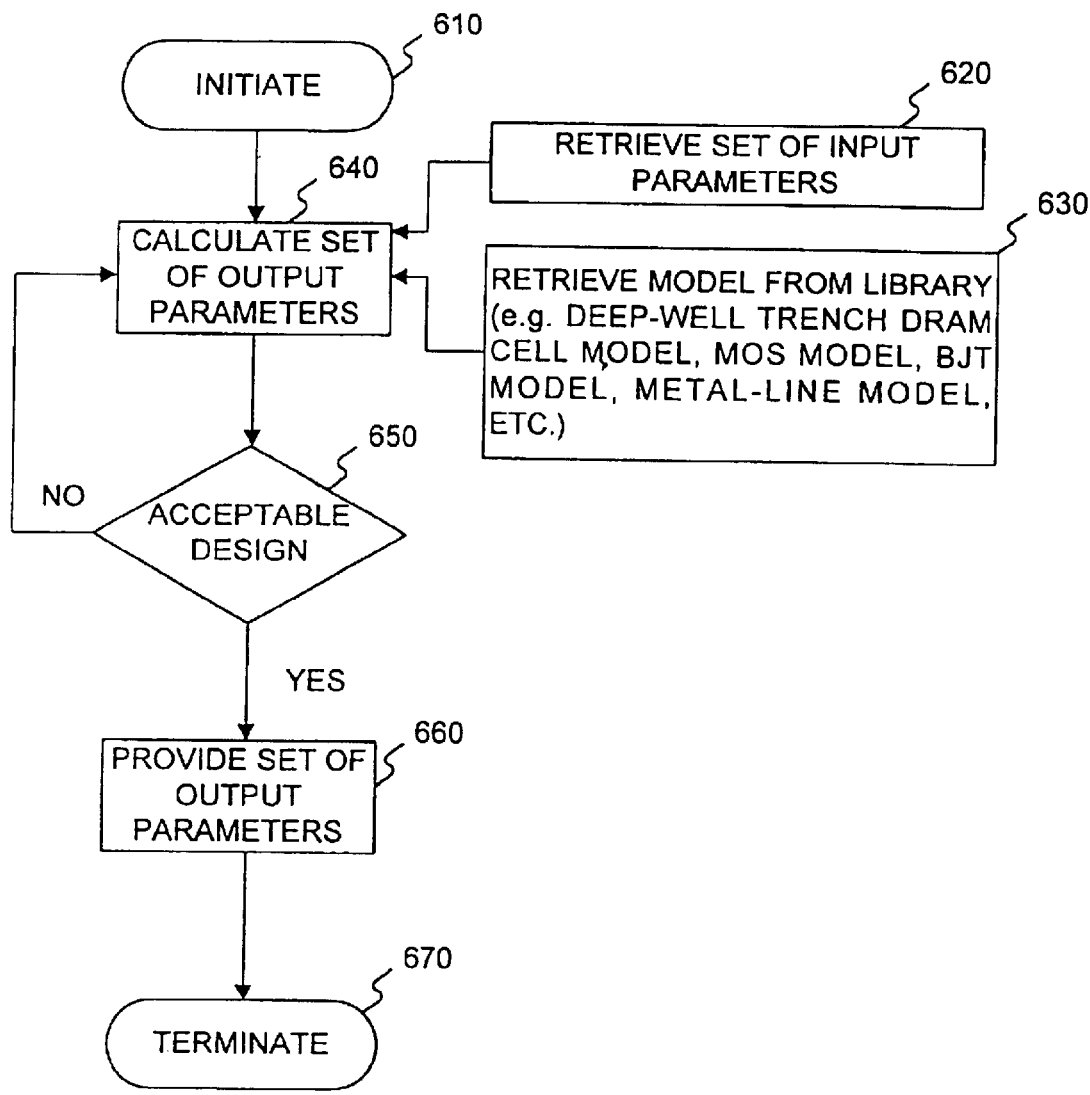
FIG. 6 is another exemplary flow chart depicting steps associated with modeling an integrated circuit using a deep-well trench DRAM cell model, in accordance with the present invention.

FIG. 6 illustrates another exemplary flow chart depicting steps associated with modeling an integrated circuit using the deep-well trench DRAM cell model, in accordance with the present invention. As illustrated in FIG. 6, a user (e.g., an engineer, a designer, or an integrated circuit designer) utilizes the input module 105 (e.g., a keyboard) to initiate or execute a circuit simulator (step 610) on the data processor 120 in order to design an integrated circuit that includes at least one of a plurality of deep-well trench DRAM cells. Once the circuit simulator is initiated, the data processor 120 retrieves a set of input parameters (step 620) from the input module 105 and retrieves the deep-well trench DRAM cell model (step 630) from a model library stored in the storage module 150. The data processor 120 calculates the set of output parameters (step 640) using, among other things, the circuit simulator, the set of input parameters, and the deep-well trench DRAM cell model. If the set of output parameters is acceptable (step 650), the data processor 120 provides the set of output parameters (step 660) to the output module 130 for displaying 135, printing 136, or forwarding 138. If the candidate set of output parameters is unacceptable (step 650), the data processor 120 repeats steps 620–650 for another set of input parameters, which correspond to another design of the integrated circuit that includes at least one of a plurality of deep-well trench DRAM cells. Preferably, the steps associated with modeling an integrated circuit terminate (step 670) after an acceptable set of output parameters are determined (step 650) and the data processor 120 provides the set of output parameters (step 660) to the output module 130.

To initiate the circuit simulator, the user utilizes the input module 105 to initiate or execute a circuit simulator (step 610) on the data processor 120. By way of non-limiting example, the user may use a keyboard to initiate the circuit simulator (e.g., SPICE, HSPICE, PSPICE, ELDO, VHDL, SMASH, SABER, or VERILOG™) to design the integrated circuit that includes at least one of a plurality of deep-well trench DRAM cells. Although in this embodiment a user initiates the circuit simulator, a processor may also initiate the circuit simulator (step 610).

To retrieve the set of input parameters (step 620), the data processor 120 retrieves the set of input parameters from the input module 105. The input module may include a keyboard (not shown), an input storage device (not shown), or any other input device capable of providing the set of input parameters to the data processor 120. The set of input parameters defines the integrated circuit that includes at least one of a plurality of deep-well trench DRAM cells. Preferably, the set of input parameters is predetermined and stored on an input storage device. By way of non-limiting example, the set of input parameters includes a wide variety of functional, performance, physical, electrical, process, and environmental information. Such information define the possible integrated circuit, which includes least one of a plurality of deep-well trench DRAM cells. For example, the set of input parameters may include one or more of the following: gate oxide thickness ($t_{ox}$), maximum applied supply voltage ($V_{dd}$), type of gate material, substrate doping concentration ($N_B$), source/drain junction depth ($N_S$, $N_D$), junction doping concentration, and operating temperature (T).

To retrieve the deep-well trench DRAM cell model (step 630), the data processor 120 retrieves the deep-well trench DRAM cell model from the model library stored on the storage module 150. Referring again to FIG. 3, the deep-well trench DRAM cell model is defined by a combination of electrically connected components including, for example, source resistance ($R_s$), drain resistance ($R_d$) borderless contact ($R_{CB}$), buried strap resistance ($R_{BS}$), deep trench resistance ($R_{DT}$), deep trench capacitance ($C_{DT}$), and coupling capacitance ($C_{GC}$). Referring again to FIG. 4, FIG. 4 illustrates cell-level interactions (e.g., noise caused by coupling from adjacent cells such as crosstalk) of the deep-well trench DRAM cells within the deep-well trench DRAM cell model. By way of non-limiting example, the deep-well trench DRAM cell model (see, e.g., FIGS. 3 and 4) permits the user to model or simulate the speed (e.g., write speed and/or read speed) and/or noise (e.g., crosstalk or coupling from adjacent cells) of a proposed integrated circuit that contains at least one of a plurality of deep-well trench DRAM cells. Consequently, this embodiment provides a novel method and apparatus for designing an integrated circuit that includes at least one of a plurality of deep-well trench DRAM cells.

Referring again to FIG. 6, to calculate the set of output parameters (step 640), the data processor 120 utilizes, among other things, the circuit simulator, the set of input parameters, and the deep-well trench DRAM cell model. The circuit simulator may consist of a variety of simulators including, for example, SPICE, HSPICE, PSPICE, ELDO, SMASH, SABER, VERILOG™, or VHDL. When the circuit simulator calculates the set of output parameters, the deep-well trench DRAM cell model serves as a constraint to the set of output parameters given the set of input parameters. The set of output parameters provides of dynamic and static information about the performance of the integrated circuit that includes at least one of a plurality of deep-well trench DRAM cells. Further, the dynamic and static information may include speed and/or noise (e.g., crosstalk from adjacent cells) associated with transient and direct current (D.C.) operation of the deep-well trench DRAM cell.

If the candidate set of output parameters is acceptable (step 650), the data processor 120 provides the set of output parameters (step 660) to the output module 130 for displaying 135, printing 136, or forwarding 138. To determine whether the set of output parameters is acceptable, the data processor 120 compares the set of output parameters to a predetermined set of criteria. By way of non-limiting example, the predetermined set of criteria may include ranges of acceptable values for the dynamic and static performance (e.g., the noise and write/read speed of the deep-well trench DRAM cells) of the at least one of a plurality of deep-well trench DRAM cells. More preferably, the specific values for the predetermined set of criteria vary on a case-by-case basis depending on the specific design. If the set of output parameters is acceptable, the set of output parameters provides an indication of the performance of the integrated circuit that is ultimately manufactured.

If the candidate set of output parameters is unacceptable (step 650), the data processor 120 repeats steps 620–650 for another set of input parameters corresponding to another design of the integrated circuit that includes at least one of a plurality of deep-well trench DRAM cells. After repeating steps 620–650 for another set of input parameters, if the corresponding set of output parameters is acceptable (step 650), the data processor 120 provides that set of output parameters (step 660) to the output module 130 for displaying 135, printing 136, or forwarding 138. If the set of output parameters is still unacceptable (step 650), the data processor 120 repeats steps 620–650. Preferably, the steps associated with modeling an integrated circuit terminate (step 670) after the data processor 120 provides the set of output parameters (step 660) that are determined to be acceptable (step 650) to the output module 130.

Thus, the present invention provides novel apparatus and method for designing and fabricating an integrated circuit that includes at least one of a plurality of deep-well trench DRAM cells.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The scope of the invention is defined by the claims and their equivalents. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for modeling an integrated circuit, comprising:
   executing a circuit simulator for designing an integrated circuit, wherein the integrated circuit contains at least one of a plurality of DRAM cells; and
   calculating a set of output parameters with the circuit simulator for each of the plurality of DRAM cells, wherein calculating the set of output parameters further comprises utilizing a means for representing a deep-well trench DRAM cell for each of the plurality of DRAM cells.

2. The method of claim 1 further comprising providing as an output the set of output parameters representative of the at least one of the plurality of DRAM cells.

3. The method of claim 1 further comprising manufacturing the integrated circuit based on the set of output parameters.

4. The method of claim 1, wherein said calculating further comprises defining the set of output parameters to comprise performance data representative of the integrated circuit with at least one of a plurality of dynamic random-access memory (DRAM) cells.

5. The method of claim 4, wherein said defining further comprises defining the performance data to include static and dynamic information.

6. The method of claim 5, wherein said defining further comprises defining the static and dynamic information to include noise information corresponding to the crosstalk between adjacent DRAM cells.

7. The method of claim 1, wherein said calculating further comprises defining the set of output parameters to comprise performance data representative of the at least one of a plurality of dynamic random-access memory (DRAM) cells.

8. The method of claim 1, wherein said calculating further comprises defining the deep-well trench DRAM cell model to further comprise a coupling capacitance ($C_{GC}$) connected in series to a terminal of a write line.

9. The method of claim 1, wherein said calculating further comprises employing SPICE as the circuit simulator.

10. An apparatus for modeling an integrated circuit, comprising:
    means for executing a circuit simulator for designing an integrated circuit, wherein the integrated circuit contains at least one of a plurality of DRAM cells; and
    means for calculating a set of output parameters with the circuit simulator for each of the plurality of DRAM cells, wherein the means for calculating the set of output parameters further comprises means for utilizing a deep-well trench DRAM cell model for each of the plurality of DRAM cells.

11. The apparatus of claim 10 further comprising output means for providing the set of output parameters representative of the at least one of the plurality of DRAM cells.

12. The apparatus of claim 10 further comprising means for manufacturing the integrated circuit based on the set of output parameters from said means for calculating.

13. The apparatus of claim 10, wherein said means for calculating further comprises means for defining the set of output parameters to comprise performance data representative of the integrated circuit with at least one of a plurality of dynamic random-access memory (DRAM) cells.

14. The apparatus of claim 13, wherein said means for defining further comprises means for defining the performance data to include static and dynamic information.

15. The apparatus of claim 14, wherein said means for defining further comprises means for defining the static and dynamic information to include noise information corresponding to crosstalk between adjacent DRAM cells.

16. The apparatus of claim 10, wherein said calculating further comprises defining the set of output parameters to comprise performance data representative of the at least one of a plurality of dynamic random-access memory (DRAM) cells.

17. The apparatus of claim 10, wherein said means for calculating further comprises means for defining the deep-well trench DRAM cell model to comprise a coupling capacitance ($C_{GC}$) connected in series to a terminal of a write line.

18. The apparatus of claim 10, wherein said means for calculating further comprises means for employing SPICE as the circuit simulator.

19. A computer program product comprising computer-readable media having computer-readable code which, when run on a computer, causes the computer to model an integrated circuit with at least one of a plurality of DRAM cells, comprising the following computer-readable program code for effecting actions in the computer:

program code for executing a circuit simulator for designing an integrated circuit, wherein the integrated circuit contains at least one of a plurality of DRAM cells; and program code for calculating a set of output parameters with the circuit simulator for each of the plurality of DRAM cells, wherein the program code for calculating the set of output parameters further comprises program code for utilizing a means for representing a deep-well trench DRAM cell for each of the plurality of DRAM cells.

20. The computer program product according to claim 19, wherein the computer program product further comprises computer code for providing the set of output parameters for at least one of the plurality of DRAM cells.

21. The computer program product according to claim 19, wherein the computer program product further comprises computer code for manufacturing the integrated circuit based on the set of output parameters from said program code for calculating.

22. The computer program product according to claim 19, wherein said program code for calculating further comprises program code for defining the set of parameters to include performance data representative of the integrated circuit with at least one of a plurality of dynamic random-access memory (DRAM) cells.

23. The computer program product according to claim 22, wherein said program code for defining further comprises program code for defining the performance data to include static and dynamic information.

24. The computer program product according to claim 23, wherein said program code for defining further comprises program code for defining the performance data to include noise information corresponding to crosstalk between adjacent DRAM cells.

25. The computer program product according to claim 19, wherein said program code for calculating further comprises program code for defining the set of output parameters to comprise performance data representative of the at least one of a plurality of dynamic random-access memory (DRAM) cells.

26. The computer program product according to claim 19, wherein said program code for calculating further comprises program code for defining the deep-well trench DRAM cell model to comprise a coupling capacitance ($C_{GC}$) connected in series to a terminal of a write line.

27. The computer program product according to claim 19, wherein said program code for calculating further comprises program code for employing SPICE as the circuit simulator.

28. A method for modeling an integrated circuit, comprising:

providing a deep-well trench DRAM cell model which includes first, second, and third terminals, a transistor including a source resistance $R_S$ and a drain resistance $R_D$, a coupling capacitance $C_{GC}$ coupled in series with $R_S$ and also coupled to the first terminal, a borderless contact resistance $R_{CB}$ coupled in series with $R_D$ and also coupled to the third terminal, a gate of the transistor coupled to the second terminal, and a deep-well trench having a deep-well trench capacitance $C_{DT}$ and a deep trench resistance $R_{DT}$, wherein the deep-well trench is represented by a series combination of $R_{DT}/2$ and $C_{DT}/2$ in parallel with $C_{DT}/2$ to form a parallel combination and $R_{DT}/2$ coupled between a point between $C_{GC}$ and $R_S$ and the parallel combination;

executing a circuit simulator for designing an integrated circuit, wherein the integrated circuit contains at least one of a plurality of DRAM cells; and calculating a set of output parameters with the circuit simulator for each of the plurality of DRAM cells, wherein calculating the set of output parameters further comprises utilizing the deep-well trench DRAM call model for each of the plurality of DRAM cells.

29. The method of claim 28, wherein $C_{GC}$ is provided to represent noise information corresponding to the crosstalk between adjacent DRAM cells.

30. The method of claim 28, wherein the transistor in the deep-well trench DRAM cell model is provided to further comprise a buried strap resistance $R_{BS}$ coupled in series between $C_{GC}$ and $R_S$, and wherein the deep-well trench is coupled to a point between $C_{GC}$ and $R_{BS}$.

31. An apparatus for modeling an integrated circuit, comprising:

means for executing a circuit simulator for designing an integrated circuit, wherein the integrated circuit contains at least one of a plurality of DRAM cells; and means for calculating a set of output parameters with the circuit simulator for each of the plurality of DRAM cells, wherein the means for calculating the set of output parameters further comprises means for utilizing a deep-well trench DRAM cell model for each of the plurality of DRAM cells, wherein the deep-well trench DRAM cell model includes first, second, and third terminals, a transistor including a source resistance $R_S$ and a drain resistance $R_D$, a coupling capacitance $C_{GC}$ coupled in series with $R_S$ and also coupled to the first terminal, a borderless contact resistance $R_{CB}$ coupled in series with $R_D$ and also coupled to the third terminal, a gate of the transistor coupled to the second terminal, and a deep-well trench having a deep-well trench capacitance $C_{DT}$ and a deep trench resistance $R_{DT}$, wherein the deep-well trench is represented by a series combination of $R_{DT}/2$ and $C_{DT}/2$ in parallel with $C_{DT}/2$ to form a parallel combination and $R_{DT}/2$ coupled between a point between $C_{GC}$ and $R_S$ and the parallel combination.

32. The apparatus of claim 31, wherein said means for defining further comprises means for defining $C_{GC}$ to represent noise information corresponding to crosstalk between adjacent DRAM cells.

33. The apparatus of claim 31, wherein said means for calculating further comprises means for defining the deep-well trench DRAM cell model to comprise a buried strap resistance $R_{BS}$ connected in series between $C_{GC}$ and $R_S$ and for defining the deep-well trench as coupled to a point between $C_{GC}$ and $R_{BS}$.

34. A computer program product comprising computer-readable media having computer-readable code which, when run on a computer, causes the computer to model an integrated circuit with at least one of a plurality of DRAM cells, comprising the following computer-readable program code for effecting actions in the computer:

program code for executing a circuit simulator for designing an integrated circuit, wherein the integrated circuit contains at least one of a plurality of DRAM cells; and program code for calculating a set of output parameters with the circuit simulator for each of the plurality of DRAM cells, wherein the program code for calculating the set of output parameters further comprises program code for utilizing a deep-well trench DRAM cell model for each of the plurality of DRAM cells, wherein the deep-well trench DRAM cell model includes first, second, and third terminals, a transistor including a source resistance $R_S$ and a drain resistance $R_D$, a coupling capacitance $C_{GC}$ coupled in series with $R_S$ and also coupled to the first terminal, a borderless contact resistance $R_{CB}$ coupled in series with $R_D$ and also coupled to the third terminal, a gate of the transistor coupled to the second terminal, and a deep-well trench having a deep-well trench capacitance $C_{DT}$ and a deep trench resistance $R_{DT}$, wherein the deep-well trench is represented by a series combination of $R_{DT}/2$ and $C_{DT}/2$ in parallel with $C_{DT}/2$ to form a parallel combination and $R_{DT}/2$ coupled between a point between $C_{GC}$ and $R_S$ and the parallel combination.

35. The computer program product according to claim 34, wherein said program code for utilizing further comprises program code for defining $C_{GC}$ to represent noise information corresponding to crosstalk between adjacent DRAM cells.

36. The computer program product according to claim 34, wherein said program code for calculating further comprises program code for defining the deep-well trench DRAM cell model to comprise a buried strap resistance $R_{BS}$ connected in series between $C_{GC}$ and $R_S$ and for defining the deep-well trench as coupled to a point between $C_{GC}$ and $R_{BS}$.

* * * * *